United States Patent [19]
Poli et al.

[11] Patent Number: 5,280,979
[45] Date of Patent: Jan. 25, 1994

[54] TIP FOR A VACUUM PIPETTE WITH IMPROVED ELECTROSTATIC DISCHARGE PROPERTIES

[75] Inventors: Bernard Poli, Aussonne; Gerard Chincholle, Toulouse, both of France

[73] Assignee: Recif, S.A., Aussonne, France

[21] Appl. No.: 717,964

[22] Filed: Jun. 20, 1991

[51] Int. Cl.⁵ .................... B25J 15/06; H05F 3/04
[52] U.S. Cl. .................... 294/64.1; 361/220
[58] Field of Search ............ 294/64.1-64.3; 29/740, 743; 271/90, 208; 361/212, 214, 215, 220, 222

[56] References Cited

U.S. PATENT DOCUMENTS

| | | | |
|---|---|---|---|
| 3,711,742 | 1/1973 | Pinkham | 361/212 |
| 4,496,180 | 1/1985 | Hillman et al. | 294/64.1 |
| 4,619,275 | 10/1986 | Ross et al. | 361/220 X |
| 4,687,242 | 8/1987 | Rooy | 294/64.1 |
| 4,697,300 | 10/1987 | Warlop | 361/212 X |
| 4,736,508 | 4/1988 | Poli et al. | 294/64.1 X |
| 4,744,594 | 5/1988 | Poli et al. | 294/64.1 |
| 4,866,565 | 9/1989 | Wray | 361/215 |
| 4,981,315 | 1/1991 | Poli et al. | 294/64.1 |
| 5,106,139 | 4/1992 | Palmer et al. | 294/64.1 |

FOREIGN PATENT DOCUMENTS

| | | | |
|---|---|---|---|
| 8904547 | 5/1989 | PCT Int'l Appl. | 294/64.1 |
| 856790 | 8/1981 | U.S.S.R. | 294/64.1 |

*Primary Examiner*—Johnny D. Cherry
*Attorney, Agent, or Firm*—Townsend and Townsend Khourie and Crew

[57] ABSTRACT

A tip for a vacuum pipette having improved electrostatic discharge properties is disclosed. The tip and the coupling sections of a known tip are separated both physically and electrically from one another. A large resistance then electrically couples the two sections together and a plastic insulator surrounds the resistance to physically couple the sections together. This construction forces all static discharges to flow through the resistor, thereby changing the static discharge from one large discharge to a series of small discharges, each small discharge being insufficient to damage the wafers. The tip is also coated with a thin ceramic coating, which acts as a barrier against ionic contamination from the material used to make the tip. This coating is also smoother and more abrasion resistant than the basic material, causing less contamination when used. Finally, the coating can have a controlled conductivity that improves the static discharge behavior of the tip.

12 Claims, 2 Drawing Sheets

TIP FOR A VACUUM PIPETTE WITH IMPROVED ELECTROSTATIC DISCHARGE PROPERTIES

BACKGROUND OF THE INVENTION

This invention is in the field of integrated circuit manufacture. More particularly, it is in the field of vacuum tools used to manipulate individual semiconductor wafers during manufacture.

During the manufacture of integrated circuits, it is often necessary to pick up and manipulate the individual semiconductor wafers upon which the circuits are fabricated. Various vacuum tools and wands are used for this purpose. The tip of one such vacuum tool is described in commonly-owned U.S. Pat. No. 4,981,315, entitled "TIP FOR A VACUUM PIPETTE", the specification of which is incorporated herein for all purposes.

Although the tips described in the referenced patent perform well, there is at least one problem which is encountered during the fabrication of integrated circuits which these tips do not solve. Often during the manufacturing process the wafers become charged with static electricity. Charged wafers attract particles in the workplace having the opposite charge. These particles, if they actually contact the wafer, can damage the circuits being formed on the wafer, causing various malfunctions. Although grounding the vacuum tools is a known technique to avoid this problem, the abrupt static discharge that can occur when a normally grounded vacuum tool comes in contact with a charged wafer can be large enough to cause damage to the circuits. Thus, a need exists for a tip for vacuum tools that permits the discharge of static electricity without damaging the circuits being formed on the wafer.

SUMMARY OF THE INVENTION

The present invention comprises a tip for a vacuum tool made of a conductive or dissipative material, the form of the tip being known and disclosed in the commonly-owned patent, the tip being coupled to a very large resistance. When the resistance is coupled to the tip, the single large electrostatic discharge which occurs when the known tips are used with charged wafers is reduced to a series of small discharges, each being too small to damage the wafer.

In a further addition to the known art, the tips are coated with a very pure ceramic coating, reducing particle contamination from the tool itself. The same ceramic coating, made with a controlled conductivity, can help adjust the impedance of the tip to permit safe electrostatic discharge of the charged wafers.

The invention will now be described in detail with reference to the drawings noted below.

DESCRIPTION OF THE SPECIFIC EMBODIMENT(S)

Figure 1:
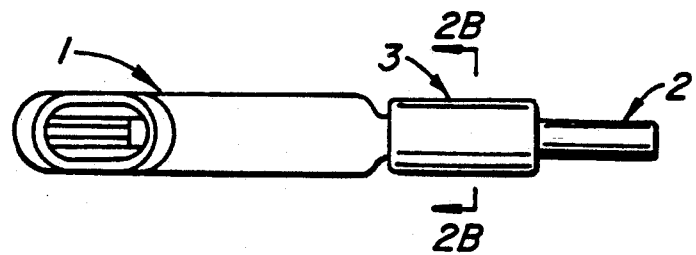
FIG. 1 is a top perspective view of the present invention.

FIG. 1 shows a vacuum tool tip of the type described in co-owned U.S. Pat. No. 4,981,315 and incorporating the improvement of the present invention. As the specification of commonly owned patent is incorporated herein for all purposes, no discussion of that tip's construction and operation, except as relevant to the improvements described herein, will be necessary.

As shown in FIG. 1, the tip can comprise poly-ether-ether-ketone ("PEEK"), poly-ether-ketone ("PEK"), or another thermoplastic material having similar properties into which conductive fibers comprised of carbon or silicon carbide have been blended. In a preferred embodiment, the tip comprises PEK blended with carbon fibers. Although the proportion of fibers to PEK can range from 5% to 12%, a preferred embodiment is comprised of 8% fibers. The entire tip area 1 is coated with a ceramic coating to prevent particle and ionic contamination from the PEK and carbon fibers. As PEK and the fibers contain such elements as Na, K, Mg and Pb, contamination from the tip can be a large source of chemical contamination for the wafers being manipulated. The coating comprises SiC, $SiO_2$ and Si and is deposited using either cold temperature plasma chemical vapor deposition or reactive sputtering. In a preferred embodiment, a reactive sputtering technique is used to coat the tip. A layer of several microns is grown on the tip. In a preferred embodiment, the layer is approximately 10 microns thick. In other embodiments, the coating may have a controlled conductivity which might replace the discrete impedance coupled to the tip and described below. Also, the coating could be made less conductive than the basic material used to fabricate the tip. When this type of coating is used, static electrical discharges would flow through the coating into the basic material of the tip. Additionally, the coating has a very low coefficient of friction which reduces the possibility of abrading the wafer. The tip further comprises a resistive section enclosed by a large PEEK cylinder 3 and connecting section 2.

Figure 2A:
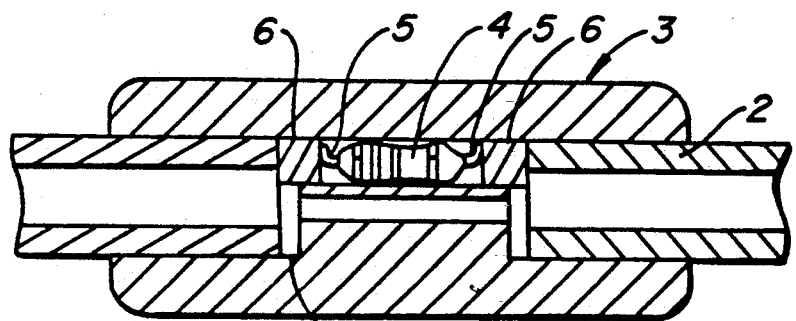
FIG. 2a is an enlarged side view of FIG. 1 cut away to reveal the impedance section of the present invention.
Figure 2B:
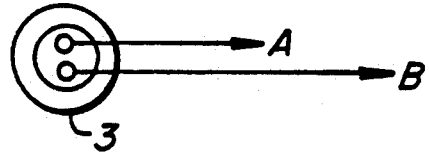
FIG. 2b is a sectional view of FIG. 1 taken along a line 2b—2b and showing the two passages A and B in the PEEK cylinder 3 prior to insertion of any components.

FIGS. 2a and 2b shows how a large resistor is incorporated into the known tip. In a preferred embodiment the resistor has a value in the range of 10 to 50 MΩ. First, a large PEEK cylinder 3 is formed with two axial passages A and B. Resistor 4 is placed into passage B and sealed in place at both ends, using small cylinders 6 comprised of PEEK with carbon fibers embedded therein. In this manner, an electrical pathway is formed from cylinders 6 through resistor 4. Also, as the metal wire of the resistor is effectively sealed, it cannot contaminate wafers and it will not be affected by cleaning chemicals, solvents, etc. Passage A permits vacuum flow through cylinder 3. Tip section 1 and tube section 2 are then inserted into the large holes at either end of cylinder 3 and make electrical contact with small cylinders 6 at points 5. Large PEEK cylinder 3 is an insulator. This ensures that all current flow from the tip will flow through resistor 4 before passing to the tube. When the tip is inserted into a vacuum tool, a coiled wire running through the vacuum tool's vacuum source connects the tip to a ground potential.

Figure 3:
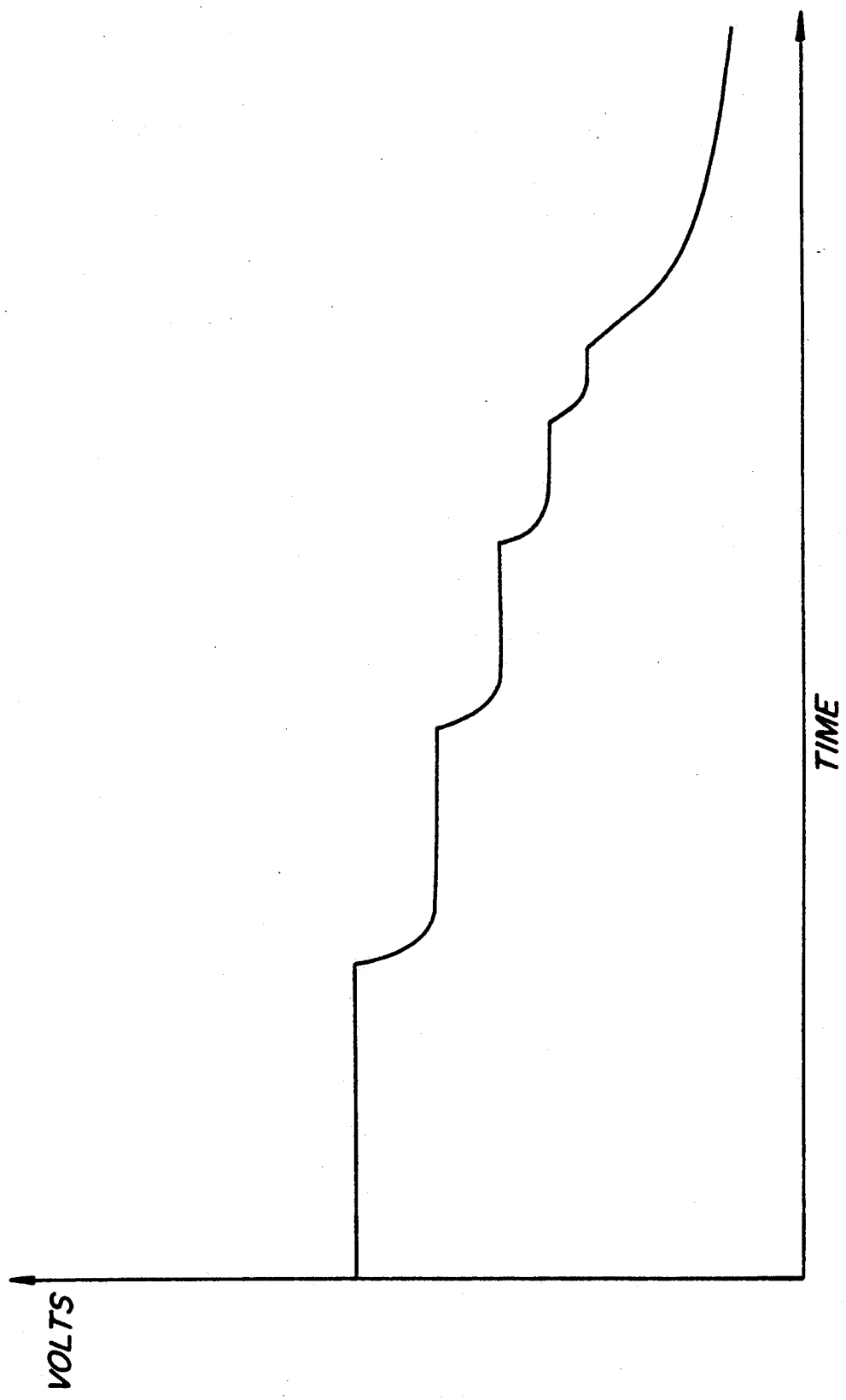
FIG. 3 is a graph showing the typical discharge of a statically charged semiconductor wafer with respect to time when a tip embodying the present invention is used to handle the wafer.

During the manufacturing process, a semiconductor wafer can become statically charged to a high voltage V, as shown in FIG. 3. It is undesirable to discharge the wafer too rapidly by directly grounding it because the current flow resulting from a rapid discharge can damage the circuits on the wafer. However, when an operator manipulates a tip incorporating the special material and resistance of the present invention to pick up a charged wafer, the static charge is discharged in a series of small discrete shocks, each too small to damage the wafer. This is shown graphically in FIG. 3 by the series of small individual scallop-shaped reductions in voltage V with respect to time t.

Although the present invention has been described in relation to a preferred embodiment, many variations, such as different resistor values, different coatings and materials can also be used. The scope of the invention should, therefore, be determined not with reference to the above description, but instead should be determined with reference to the appended claims along with their full scope of equivalents.

What is claimed is:

1. A tip for use with a vacuum tool for manipulating semiconductor wafers, the tool having means to electrically connect the tip to a low potential, the tip comprising:

electrically conductive connecting means for coupling the tip to the tool;

electrically conductive wafer gripping means for contacting and applying vacuum to a wafer;

a source of electrical resistance connecting said connecting means and said wafer gripping means, said source of electrical resistance being operative to limit the discharge of accumulated charge between a wafer and said tip to prevent a discharge having sufficient energy to damage the contents of said wafer; and internal duct means coupled to said wafer gripping means and extending to the tool for communicating vacuum from the tool to said wafer gripping means.

2. The tip of claim 1 wherein said source of electrical resistance has an electrical resistance in the range of approximately 10 to 50 MΩ.

3. The tip of claim 1 wherein the wafer gripping means and the connecting means are comprised of a thermoplastic material with conductive fibers embedded therein.

4. The tip of claim 3 including coupling means for coupling said wafer gripping means to said connecting means, comprising an electrically non-conductive thermoplastic material with the source of electrical resistance embedded therein.

5. The tip of claim 3 wherein the thermoplastic material is one of poly-ether-ether-ketone and poly-ether-ketone and the conductive fibers are comprised of one of carbon fibers and silicon carbide fibers.

6. The tip of claim 5 wherein the thermoplastic material is poly-ether-ketone and the fibers are carbon fibers, the percentage of carbon fibers being 8%.

7. The tip of claim 1 wherein the wafer gripping means is coated with a ceramic coating to minimize chemical contamination from the tip while allowing charge to transfer from the wafer to the tip.

8. The tip of claim 7 wherein the coating is comprised of silicon carbide, silicon dioxide and silicon.

9. The tip of claim 8 wherein the coating is between about 3 and 10 microns thick.

10. The tip of claim 1 wherein said source of electrical resistance is operative to discharge the accumulated charge from a wafer in a series of relatively small discharges.

11. A tip for a vacuum tool for manipulating semiconductor wafers, the tip comprising:

electrically conductive connecting means adapted for coupling the tip to the tool and for connecting the tip to a low potential;

an electrically conductive wafer gripping area coupled to the connecting means and having an opening for applying vacuum to a wafer;

a coating on the wafer gripping area providing an electrical resistance between the wafer and the tip low enough to allow charge accumulated on the wafer to flow to the tip but high enough to limit the rate of charge flow to prevent damage to the contents of the wafer; and internal duct means coupled to the opening, and extending through the connecting means for communicating vacuum to said wafer gripping area.

12. The tip of claim 11 where the resistive coating has a resistance between about 10 to 50 MΩ.

* * * * *